(12) United States Patent
Chen et al.

(10) Patent No.: US 7,940,199 B2
(45) Date of Patent: May 10, 2011

(54) METHOD FOR CALIBRATING ANALOG-TO-DIGITAL CONVERTING CIRCUITS

(75) Inventors: Chien-Ming Chen, Hsin-Chu (TW); Chen-Yu Hsiao, Pingtung County (TW)

(73) Assignee: Mediatek Inc., Science-Based Industrial Park, Hsin-Chu (TW)

(*) Notice: Subject to any disclaimer, the term of this patent is extended or adjusted under 35 U.S.C. 154(b) by 30 days.

(21) Appl. No.: 12/487,626

(22) Filed: Jun. 18, 2009

(65) Prior Publication Data

US 2010/0127905 A1   May 27, 2010

Related U.S. Application Data

(60) Provisional application No. 61/117,581, filed on Nov. 25, 2008.

(51) Int. Cl.
*H03M 1/10* (2006.01)

(52) U.S. Cl. .......................................... 341/120; 324/74

(58) Field of Classification Search ........... 341/120–155
See application file for complete search history.

(56) References Cited

U.S. PATENT DOCUMENTS

| | | | |
|---|---|---|---|
| 5,248,970 A * | 9/1993 | Sooch et al. .................. 341/120 |
| 6,262,569 B1 * | 7/2001 | Carr et al. ....................... 324/74 |
| 6,556,156 B1 * | 4/2003 | Hungerbuehler ............. 341/120 |
| 6,933,876 B1 * | 8/2005 | Underbrink et al. .......... 341/162 |
| 7,106,240 B2 * | 9/2006 | Cringean ....................... 341/163 |
| 7,128,270 B2 * | 10/2006 | Silverbrook et al. ..... 235/472.01 |
| 7,161,514 B2 * | 1/2007 | Tamba .......................... 341/120 |
| 7,170,811 B1 * | 1/2007 | Allen ............................ 365/226 |
| 7,312,734 B2 * | 12/2007 | McNeill et al. ............... 341/120 |

* cited by examiner

*Primary Examiner* — Lam T Mai (74) *Attorney, Agent, or Firm* — Winston Hsu; Scott Margo (57) ABSTRACT

A method for calibrating at least one analog-to-digital converting circuits includes: during a wafer level probe testing or a chip level testing, inputting at least one calibration signal into the analog-to-digital converting circuit to generate at least one digital signal; and calibrating gain or offset of the analog-to-digital converting circuit according to at least the digital signal.

22 Claims, 6 Drawing Sheets

FIG. 5

METHOD FOR CALIBRATING ANALOG-TO-DIGITAL CONVERTING CIRCUITS

CROSS REFERENCE TO RELATED APPLICATIONS

This application claims the priority of U.S. Provisional Application No. 61/117,581, filed Nov. 25, 2008, which is included herein by reference in its entirety.

BACKGROUND OF THE INVENTION

The present invention relates to a method for calibrating analog-to-digital converting circuits, and more particularly, to a method for calibrating analog-to-digital converting circuits in a wafer level probe testing process or a chip level testing process.

A video system has three channels, respectively known as red channel, green channel and blue channel. Each of the channels includes an analog-to-digital converter (ADC), and the channels are used, respectively, to receive red, green and blue signals and perform analog-to-digital converting operations on the red, green and blue signals to generate red, green and blue digital codes.

Theoretically, the ADCs in the red, green and blue channels should output the same digital codes when receiving input signals with the same analog color level. However, due to semiconductor process variations, the ADCs in different channels may require different gains to output the same digital codes. Therefore, the gains of the ADCs need to be calibrated. Generally, this calibration step proceeds in a production line by a machine that is dedicated for the calibration; that is, the calibration proceeds in a system level. Therefore, large amounts of manpower and time are required, and cost of the production line is increased.

SUMMARY OF THE INVENTION

It is therefore an objective of the present invention to provide a method for calibrating analog-to-digital converting circuits in a wafer level probe testing or a chip level testing, to solve the above-mentioned problems.

According to one embodiment of the present invention, a method for calibrating at least one analog-to-digital converting circuit comprises: during a wafer level probe testing, inputting at least one calibration signal into the analog-to-digital converting circuit to generate at least one digital signal; and calibrating the analog-to-digital converting circuit according to at least the digital signal.

According to another embodiment of the present invention, a method for calibrating at least one analog-to-digital converting circuit comprises: during a chip level testing, inputting at least one calibration signal into the analog-to-digital converting circuit to generate at least one digital signal; and calibrating the analog-to-digital converting circuit according to at least the digital signal.

According to the embodiments of the present invention, the calibration step is integrated with the wafer level probe testing or the chip level testing. Because a voltage level of the calibration signal provided by the machine utilized for the wafer level probe testing or the chip level testing has less variation, the calibration result are precise. In addition, because the calibration step is in the wafer level or the chip level, rather than in the system level, the cost of the production line can also be decreased.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
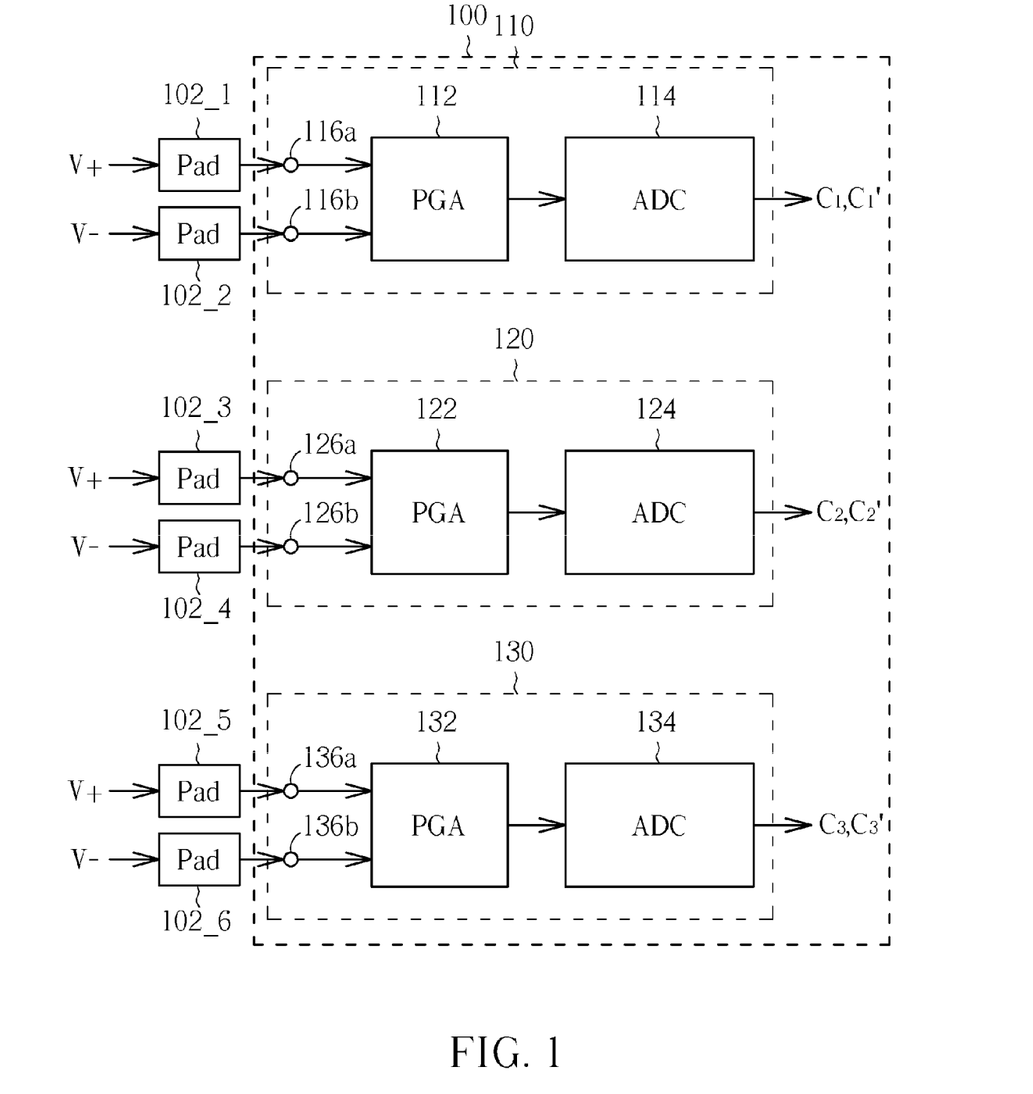
FIG. 1 is a diagram illustrating a video system according to one embodiment of the present invention.

Please refer to FIG. 1. FIG. 1 is a diagram illustrating a video system 100 according to one embodiment of the present invention. The video system (such as a TV system, a digital TV system or a video player system) 100 includes three analog-to-digital converting circuits 110, 120 and 130, where the analog-to-digital converting circuit 110 includes two input nodes 116a and 116b, a programmable gain amplifier (PGA) 112 and an adjustable analog-to-digital converter (ADC) 114, the analog-to-digital converting circuit 120 includes two input nodes 126a and 126b, a PGA 122 and an adjustable ADC 124, and the analog-to-digital converting circuit 130 includes two input nodes 136a and 136b, a PGA 132 and an adjustable ADC 134. In addition, the analog-to-digital converting circuits 110, 120 and 130 are positioned in red, green and blue channels of the video system, respectively, and each analog-to-digital converting circuit is used for receiving an input analog signal to generate corresponding digital codes.

Figure 2:
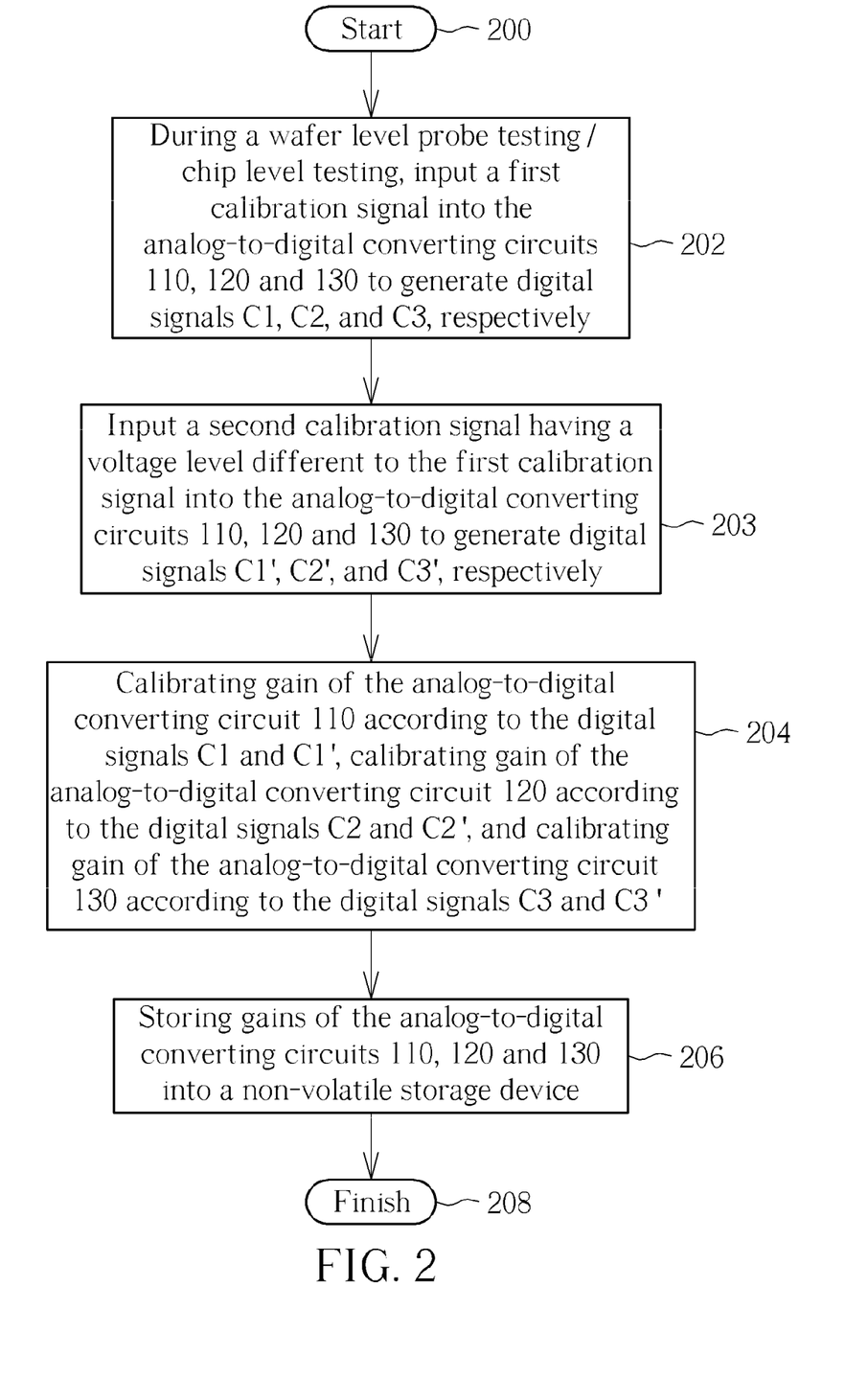
FIG. 2 is a diagram illustrating a flowchart of calibrating the analog-to-digital converting circuits according to one embodiment of the present invention.

Please refer to FIG. 1 and FIG. 2 together. FIG. 2 is a diagram illustrating a flowchart of calibrating the analog-to-digital converting circuits 110, 120 and 130 according to one embodiment of the present invention. Please note that, provided the result is substantially the same, the steps are not limited to be executed according to the exact order shown in FIG. 2, and other steps may be inserted between two successive steps of the flow chart. Referring to the flowchart shown in FIG. 2, a flow of calibrating the analog-to-digital converting circuits 110, 120 and 130 is described as follows:

In Step 200, the calibration starts; the input nodes of the analog-to-digital converting circuits 110, 120 and 130 are coupled to the pads 102_1-102_6. The pads 102_1-102_6 are conventionally utilized to receive wafer level probe testing signals or chip level testing signals. In one embodiment where the calibration process is integrated with the wafer level probe testing process, the pads 102_1-102_6 not only receive wafer level probe testing signals for testing the performance of the wafer but also receive calibration signals for calibrating the analog-to-digital converting circuits 110, 120 and 130. Similarly, in another embodiment where the calibration process is integrated with the chip level testing process, the pads 102_1-102_6 not only receive chip level testing signals for testing the performance of the IC but also receive calibration signals for calibrating the analog-to-digital converting circuits 110, 120 and 130.

Figure 4A:
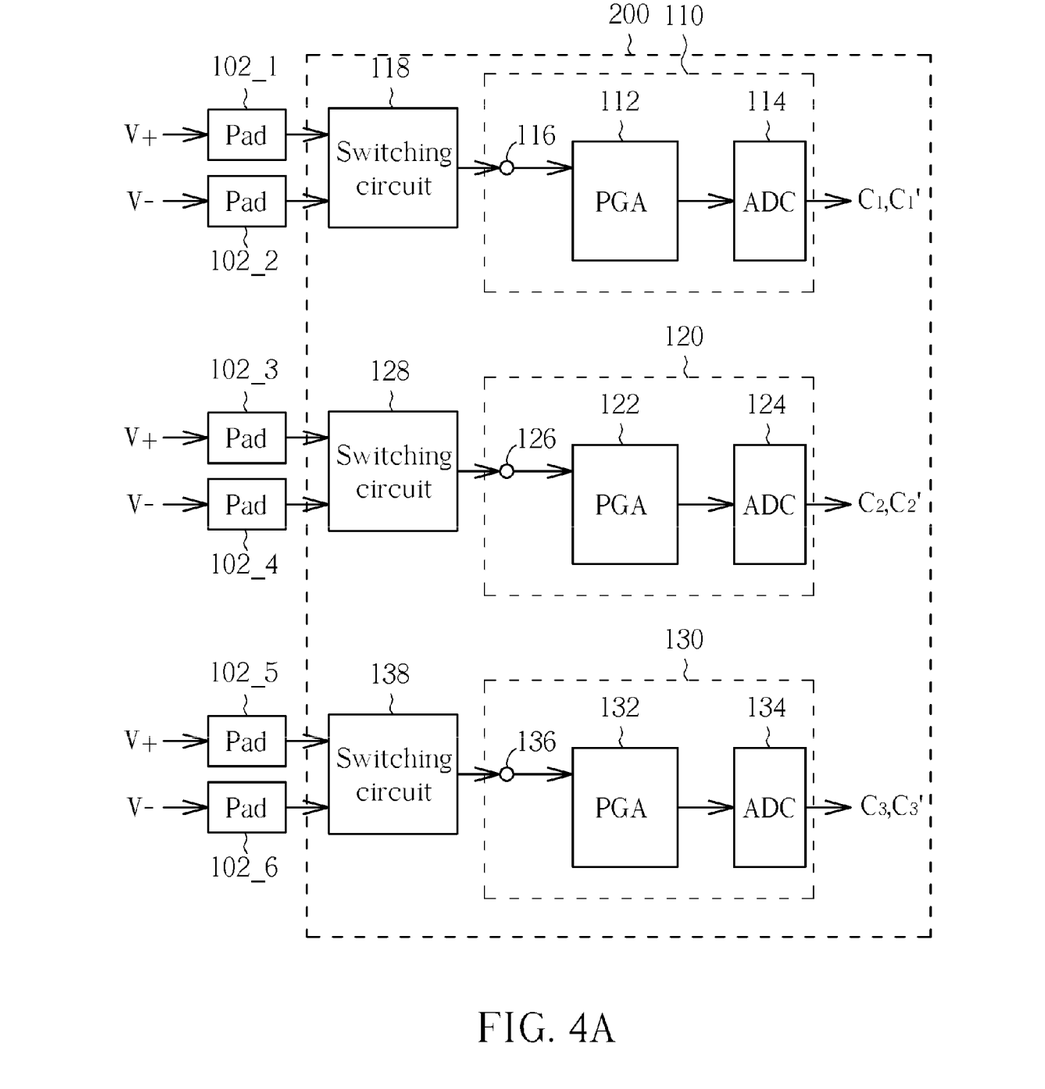
FIG. 4A is a diagram illustrating a video system according to another embodiment of the present invention.
Figure 4B:
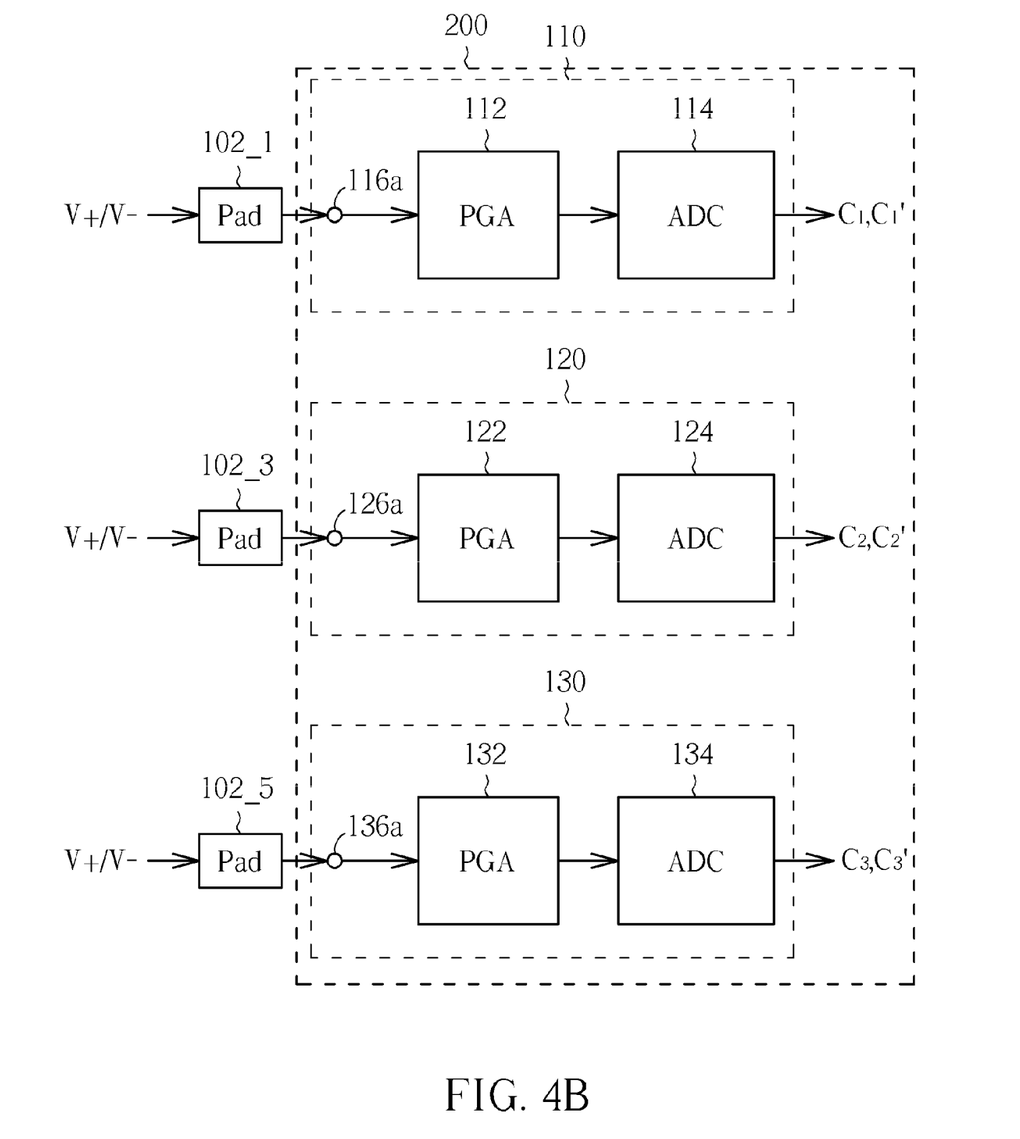
FIG. 4B is a diagram illustrating a video system according to another embodiment of the present invention.

In Step 202, during the wafer level probe testing or the chip level testing, a first calibration signal V+ is inputted into the analog-to-digital converting circuits 110, 120 and 130 via the pads 102_1, 102_3 and 102_5 to generate first digital signals C1, C2 and C3, respectively; and then in Step 203, a second calibration signal V− is inputted into the analog-to-digital converting circuits 110, 120 and 130 via the pads 102_2, 102_4 and 102_6 to generate second digital signals C1', C2' and C3', respectively. It should be noted that although two input nodes and two pads are illustrated for each analog-to-digital converting circuit to receive input signals, it is not meant to be a limitation of the present invention. For example, one input node with a switching circuit (or a multiplexer) coupled between the pads and the input node may be adopted as shown in FIG. 4A. FIG. 4A is a diagram illustrating a video system 200 according to another embodiment of the present invention. As a person skilled in this art can understand the operations of the video system 200 after reading the disclosure about the video system 100, further descriptions are therefore omitted here. Moreover, one input node with one pad is also feasible; please refer to FIG. 4B, the pad may receive the first calibration signal V+ and the second calibration signal V− sequentially. In one embodiment, the first calibration signal V+ and the second calibration signal V− is a differential pair. However, as long as two different voltage signals are applied as the first calibration signal and the second calibration signal, substantially the same function can be achieved; that is, obtaining two sets of digital signals C1, C2 and C3, and C1', C2' and C3'. These modifications all fall within the scope of the present invention.

Then, in Step 204, the analog-to-digital transfer functions of the analog-to-digital converting circuits 110, 120 and 130 are calibrated. Gains of the analog-to-digital converting circuits 110, 120 and 130 are determined based on the first digital signals C1, C2 and C3 and the second digital signals C1', C2' and C3'. The calibration amount for compensating the non-ideal characteristic of each analog-to-digital converting circuit is then determined. In one embodiment, the gains of the analog-to-digital converting circuits 110, 120 and 130 are calibrated by calibrating gains of the PGAs 112, 122 and 132. In another embodiment, the gains of the analog-to-digital converting circuits 110, 120 and 130 are calibrated by calibrating gains of the ADCs 114, 124 and 134.

Please note Steps 202-204 can be performed on the analog-to-digital converting circuits 110, 120 and 130 simultaneously or sequentially. In other words, the analog-to-digital converting circuits 110, 120 and 130 can be calibrated simultaneously, or the analog-to-digital converting circuits 110 can be calibrated first, and the analog-to-digital converting circuits 120 and 130 can be calibrated after the analog-to-digital converting circuit 110 finishes calibration.

Figure 3:
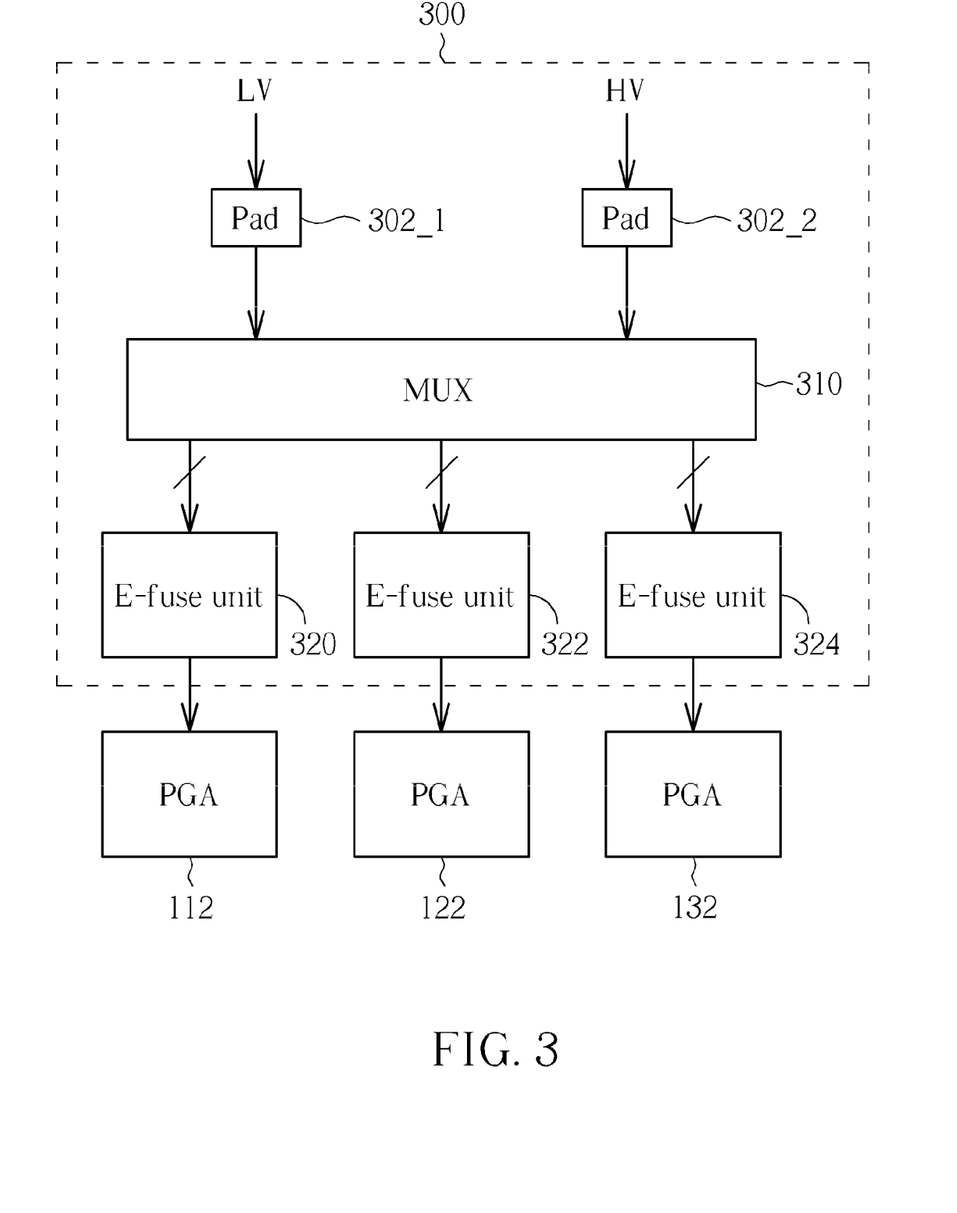
FIG. 3 is a diagram illustrating the E-fuse storage device according to one embodiment of the present invention.

In Step 206, the calibration result such as gains of the PGAs 112, 122 and 132 determined in Step 204 are stored in a non-volatile storage device such as an electronic fuse (E-fuse) storage device 300 shown in FIG. 3. Finally, the flow enters Step 208 to finish the calibration. In this way, when the analog-to-digital converting circuits 110, 120 and 130 function, PGAs 112, 122 and 132 read the calibrated gains from the storage device 300, thereby produce calibrated digital codes. Since the calibrated gains are stored in the non-volatile storage device, the calibration process can only be performed one time before the chip enters the production line.

FIG. 3 is a diagram illustrating the E-fuse storage device 300 according to one embodiment of the present invention. E-fuse storage device 300 includes two pads 302_1 and 302_2, a multiplexer 310, and three E-fuse units 320, 322 and 324. The gains of the PGAs 112, 122 and 132 determined in Step 204 are stored in the E-fuse units 320, 322 and 324, respectively, via the pads 302_1 and 302_2 and the multiplexer 310 by using a high voltage HV and/or a low voltage LV. The E-fuse storage device 300 may be a separate device, or the E-fuse storage device 300 and the analog-to-digital converting circuits 110, 120 and 130 may be formed on the same substrate.

However, the present invention is not limited to store the gains of the PGAs 112, 122 and 132 in the E-fuse storage device 300; other storage devices, such as poly-fuse, metal trim and ROM, can also be utilized in Step 206.

The wafer level probe testing is a process before a die is packaged, and the chip level testing is a process after packaging but before the chip is used in the video system. For simplicity, both the wafer level probe testing and the chip level testing are processes performed before the chip enters the production line of the video system such as a TV or a DVD player.

When the calibration signals V+ and V− are provided by the wafer level probe testing machine or the chip level testing machine, voltage levels of the calibration signals V+ and V− are carefully adjusted and are highly precise. Therefore, the gains of the analog-to-digital converting circuits 110, 120 and 130 can be accurately determined. In addition, the analog-to-digital converting circuits 110, 120 and 130 are coupled to the E-fuse units 320, 322 and 324, respectively, and the gains of the analog-to-digital converting circuits 110, 120 and 130 are permanently set. Therefore, the gain calibration steps may not need to be performed whenever the video system is turned on.

It is noted that, in Step 204 shown in FIG. 2, gains of the PGAs 112, 122 and 132 are calibrated, and in FIG. 3, the E-fuse units 320, 322 and 324 are coupled to the PGAs 112, 122 and 132, respectively. However, in other embodiments of the present invention, gains of the ADCs 114, 124 and 134 may be calibrated; or, gains of the PGA and ADC are both calculated, and the E-fuse units 320, 322 and 324 are coupled to the PGAs and ADCs.

Figure 5:
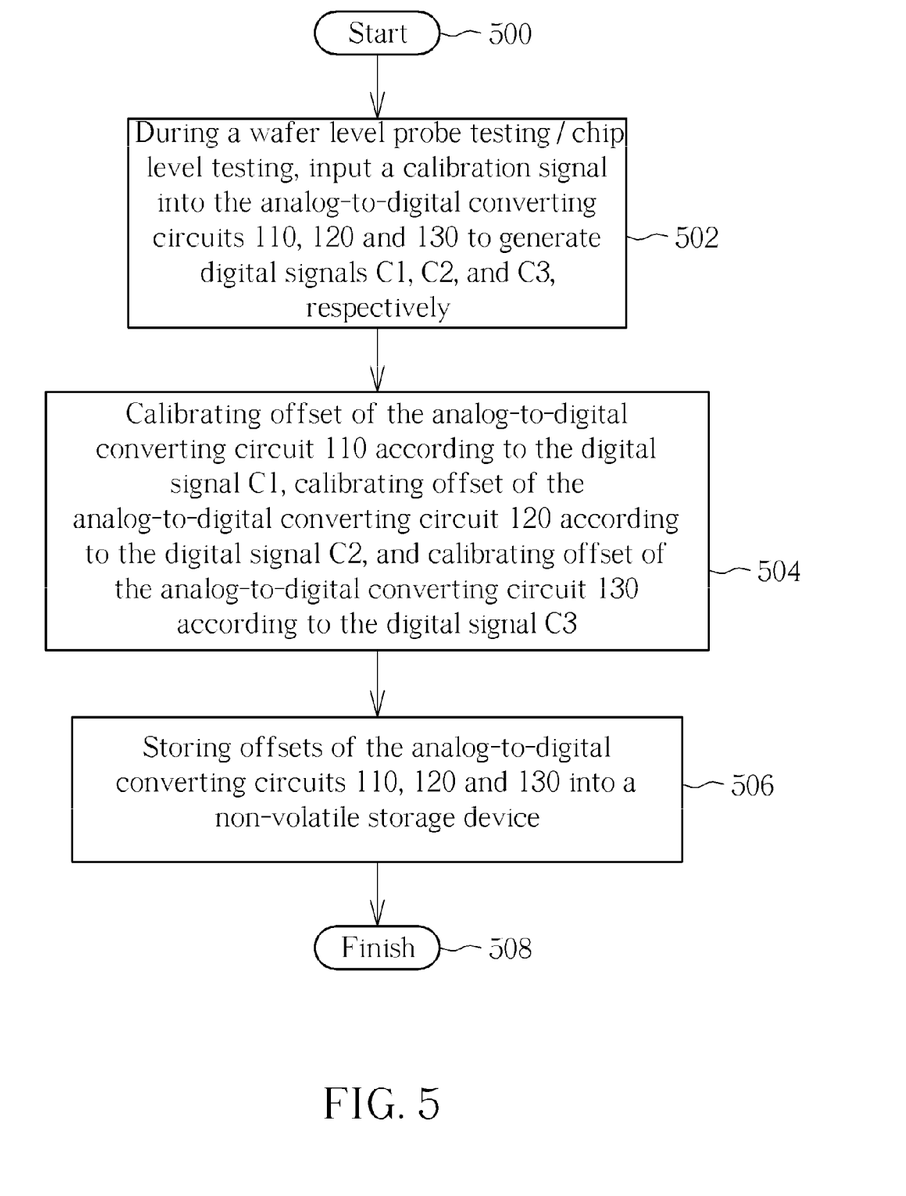
FIG. 5 is a diagram illustrating a flowchart of calibrating the analog-to-digital converting circuits according to another embodiment of the present invention.

The above-mentioned embodiments describe how to calibrate the gains of the analog-to-digital converting circuits 110, 120 and 130. However, as a person with ordinary skill in the art would appreciate, the above-mentioned structures and flow chart could extend to calibrate the offsets of the analog-to-digital converting circuits 110, 120 and 130 after some modifications. In this embodiment, one calibration signal is required, and the calibration flow chart shown in FIG. 5 is as follows.

In Step 500, the calibration starts; the input nodes 116a (or 116), 126a (or 126), and 136a (or 136) of the analog-to-digital converting circuits 110, 120 and 130 are coupled to the pads 102_1, 102_3, and 102_5.

In Step 502, during the wafer level probe testing or the chip level testing, a calibration signal is inputted into the analog-to-digital converting circuits 110, 120 and 130 via the pads to generate digital signals C1, C2 and C3, respectively. In one embodiment, the calibration signal corresponds to the middle point of the input dynamic range of the analog-to-digital converting circuits 110, 120 and 130.

Then, in Step 504, the offsets of the analog-to-digital converting circuits 110, 120 and 130 are determined based on the digital signals C1, C2 and C3. The calibration amounts are determined by making the digital signals C1, C2 and C3 be the same In Step 506, the calibration results determined in Step 504 are stored in a non-volatile storage device such as an electronic fuse (E-fuse) storage device 300 shown in FIG. 3. Finally, the flow enters Step 508 to finish the calibration. In this way, when the analog-to-digital converting circuits 110, 120 and 130 function, the calibrated offsets are read from the storage device 300, thereby produce calibrated digital codes. Since the calibrated offsets are stored in the non-volatile storage device, the calibration process can only be performed one time before the chip enters the production line.

Briefly summarized, in the calibration method of the present invention, the calibration step is performed during the wafer level probe testing or the chip level testing, and the calibrated gains or offsets of the analog-to-digital converting circuits are stored in a non-volatile storage device. There are at least three advantages of this method: first, because a voltage level of the calibration signal provided in the wafer level probe testing or the chip level testing has less variation, the calibrated gains/offsets of the analog-to-digital converting circuits are more precise. Second, because the calibrated gains/offsets are stored in the non-volatile storage device, the calibration steps may not need to be performed whenever the video system is turned on. Third, the calibration step is in the wafer level or the chip level, so the cost of the production line can also be decreased.

Please note that the present invention is not limited to calibrate a video system having three (R/G/B) channels. The above-mentioned calibration process can be applied to calibrate only one of (or part of) the analog-to-digital converting circuits 110, 120 and 130, and may also be applied to an audio system. An audio system may comprise an analog-to-digital converting circuit for converting an analog audio input signal into a corresponding digital code, where the analog-to-digital converting circuit may comprise a PGA and an ADC. During the wafer level probe testing or chip level probe testing, the calibration signal(s) is inputted into the analog-to-digital converting circuit to generate digital signal(s), and gain or offset of the analog-to-digital converting circuit is then calibrated according to the digital signal(s). When an audio signal is split into a left-channel signal and a right-channel signal before inputted to an audio system, however, the audio system may comprise two analog-to-digital converting circuits respectively for converting the left-channel signal and the right-channel signal into corresponding digital codes, where each analog-to-digital converting circuit may comprise a PGA and an ADC. Similarly, the calibration process can be utilized to calibrate gains or offsets of the analog-to-digital converting circuits by inputting calibration signal(s) into the analog-to-digital converting circuits during wafer level probe testing process or chip level testing process, and the calibration results can be stored in a non-volatile storage device such as an E-fuse device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for calibrating at least one analog-to-digital converting circuit, comprising:
   during a wafer level probe testing, inputting at least one calibration signal provided by a wafer level testing machine via pad into the analog-to-digital converting circuit to generate at least one digital signal; and
   calibrating the analog-to-digital converting circuit according to at least the digital signal.

2. The method of claim 1, wherein the step of calibrating the analog-to-digital converting circuit comprises:
   calibrating gain or offset of the analog-to-digital converting circuit to compensate non-ideal characteristic of the analog-to-digital converting circuit.

3. The method of claim 2, wherein when calibrating the gain of the analog-to-digital converting circuit, the inputting step comprises inputting at least two calibration signals into the analog-to-digital converting circuit to generate at least two digital signals; and the calibrating step comprises calibrating the gains of the analog-to-digital converting circuit according to the digital signals.

4. The method of claim 1, wherein the analog-to-digital converting circuit comprises a programmable gain amplifier, and the step of calibrating the analog-to-digital converting circuit according to at least the digital signal comprises:
   calibrating the programmable gain amplifier according to the digital signal.

5. The method of claim 1, wherein the analog-to-digital converting circuit comprises an adjustable analog-to-digital converter, and the step of calibrating the analog-to-digital converting circuit according to at least the digital signal comprises:
   calibrating the adjustable analog-to-digital converter according to the digital signal.

6. The method of claim 1, further comprising:
   storing calibration result into a non-volatile storage device.

7. The method of claim 6, wherein the non-volatile storage device is an electronic fuse (E-fuse) storage device.

8. The method of claim 6, wherein the non-volatile storage device and the analog-to-digital converting circuit are formed on a same substrate.

9. The method of claim 1, applied to a video system, wherein the analog-to-digital converting circuit is responsible for converting a Red, Green, or Blue signal into corresponding digital code.

10. The method of claim 1, applied to an audio system, wherein the analog-to-digital converting circuit is responsible for converting an analog audio signal into corresponding digital code.

11. A method for calibrating at least one analog-to-digital converting circuit, comprising:
   during a chip level testing, inputting at least one calibration signal provided by a chip level testing machine via pad into the analog-to-digital converting circuit to generate at least one digital signal; and
   calibrating the analog-to-digital converting circuit according to at least the digital signal.

12. The method of claim 11, wherein the step of calibrating the analog-to-digital converting circuit according to the digital signal comprises:
   calibrating gain or offset of the analog-to-digital converting circuit.

13. The method of claim 12, wherein when calibrating the gain of the analog-to-digital converting circuit, the inputting step comprises inputting at least two calibration signals into the analog-to-digital converting circuit to generate a plurality of digital signals; and the calibrating step comprises calibrating the gain of the analog-to-digital converting circuit according to the digital signals.

14. The method of claim 11, wherein the analog-to-digital converting circuit comprises a programmable gain amplifier, and the step of calibrating the gain or offset of the analog-to-digital converting circuit according to the digital signal comprises:
   calibrating gain or offset of the programmable gain amplifier according to the digital signal.

15. The method of claim 11, wherein the analog-to-digital converting circuit comprises an adjustable analog-to-digital converter, and the step of calibrating the analog-to-digital converting circuit according to at least the digital signal comprises:
   calibrating the adjustable analog-to-digital converter according to the digital signal.

16. The method of claim 11, further comprising:
   storing calibration results into a non-volatile storage device.

17. The method of claim 16, wherein the non-volatile storage device is an electronic fuse (E-fuse) storage device.

18. The method of claim 16, wherein the non-volatile storage device and the analog-to-digital converting circuit are formed on a same substrate.

19. The method of claim 11, applied to a video system, wherein the analog-to-digital converting circuit is responsible for converting a Red, Green, or Blue signal into corresponding digital code.

20. The method of claim 11, applied to an audio system, wherein the analog-to-digital converting circuit is responsible for converting an analog audio signal into corresponding digital code.

21. A method for calibrating at least one analog-to-digital converting circuit, comprising:
   during a wafer level probe testing, inputting at least one calibration signal into the analog-to-digital converting circuit to generate at least one digital signal; and
   calibrating the analog-to-digital converting circuit according to at least the digital signal;
   wherein the step of calibrating the analog-to-digital converting circuit comprises:
      calibrating gain or offset of the analog-to-digital converting circuit to compensate non-ideal characteristic of the analog-to-digital converting circuit; and
      when calibrating the gain of the analog-to-digital converting circuit, the inputting step comprises inputting at least two calibration signals into the analog-to-digital converting circuit to generate at least two digital signals; and the calibrating step comprises calibrating the gains of the analog-to-digital converting circuit according to the digital signals.

22. A method for calibrating at least one analog-to-digital converting circuit, comprising:
   during a chip level testing, inputting at least one calibration signal into the analog-to-digital converting circuit to generate at least one digital signal; and
   calibrating the analog-to-digital converting circuit according to at least the digital signal;
   wherein the step of calibrating the analog-to-digital converting circuit according to the digital signal comprises:
      calibrating gain or offset of the analog-to-digital converting circuit; and
      when calibrating the gain of the analog-to-digital converting circuit, the inputting step comprises inputting at least two calibration signals into the analog-to-digital converting circuit to generate a plurality of digital signals; and the calibrating step comprises calibrating the gain of the analog-to-digital converting circuit according to the digital signals.

* * * * *